United States Patent
Li et al.

(10) Patent No.: US 11,302,722 B2
(45) Date of Patent: Apr. 12, 2022

(54) ARRAY SUBSTRATE, MANUFACTURING METHOD THEREOF AND DISPLAY DEVICE

(71) Applicant: BOE TECHNOLOGY GROUP CO., LTD., Beijing (CN)

(72) Inventors: Haixu Li, Beijing (CN); Zhanfeng Cao, Beijing (CN); Qi Yao, Beijing (CN); Dapeng Xue, Beijing (CN); Shuilang Dong, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 410 days.

(21) Appl. No.: 16/314,298

(22) PCT Filed: Mar. 27, 2018

(86) PCT No.: PCT/CN2018/080635
§ 371 (c)(1),
(2) Date: Dec. 28, 2018

(87) PCT Pub. No.: WO2019/033758
PCT Pub. Date: Feb. 21, 2019

(65) Prior Publication Data
US 2021/0013243 A1  Jan. 14, 2021

(30) Foreign Application Priority Data
Aug. 14, 2017 (CN) .......................... 201710692964.0

(51) Int. Cl.
*H01L 27/12* (2006.01)
*H01L 27/32* (2006.01)

(52) U.S. Cl.
CPC ........ *H01L 27/1248* (2013.01); *H01L 27/127* (2013.01); *H01L 27/1225* (2013.01); *H01L 27/3209* (2013.01)

(58) Field of Classification Search
CPC ... H01L 27/1248; H01L 27/0688–0694; H01L 27/0617; H01L 27/0922
See application file for complete search history.

(56) References Cited

U.S. PATENT DOCUMENTS 9,246,007 B2  1/2016  Cheng et al.
9,985,082 B2  5/2018  Lee et al.
(Continued)

FOREIGN PATENT DOCUMENTS

CN  1598677 A   3/2005
CN  1870276 A   11/2006
(Continued)

OTHER PUBLICATIONS

Chinese Office Action dated Apr. 12, 2019, from application No. 201710692964.0.
(Continued)

*Primary Examiner* — Amar Mowa
(74) *Attorney, Agent, or Firm* — Arch & Lake LLP

(57) ABSTRACT

An array substrate, manufacturing method thereof, and a display device according to some arrangements of the present disclosure include: a first transistor and a second transistor; an active layer of the second transistor is disposed on a side of the interlayer dielectric layer of the first transistor away from the substrate; an insulating layer is disposed between the interlayer dielectric layer of the first transistor and the active layer of the second transistor, and the insulating layer has an ability to block hydrogen.

8 Claims, 1 Drawing Sheet

(56) References Cited

U.S. PATENT DOCUMENTS

| | | | |
|---|---|---|---|
| 10,388,710 B2 | 8/2019 | Lee et al. | |
| 10,453,965 B2 | 10/2019 | Yamaguchi et al. | |
| 10,475,824 B2 | 11/2019 | Ren et al. | |
| 10,490,669 B2 | 11/2019 | Ding et al. | |
| 2002/0102758 A1 | 8/2002 | Yonehara et al. | |
| 2005/0046342 A1* | 3/2005 | Park | H01L 51/5209 313/504 |
| 2011/0031497 A1 | 2/2011 | Yamazaki et al. | |
| 2014/0110702 A1 | 4/2014 | Cheng et al. | |
| 2014/0326990 A1 | 11/2014 | Wang et al. | |
| 2015/0048320 A1 | 2/2015 | Lee et al. | |
| 2015/0076496 A1* | 3/2015 | Tanaka | H01L 21/02565 257/43 |
| 2018/0012947 A1* | 1/2018 | Lee | H01L 27/1225 |
| 2018/0076239 A1 | 3/2018 | Suzumura et al. | |
| 2018/0240855 A1 | 8/2018 | Lee et al. | |
| 2018/0286888 A1 | 10/2018 | Yamaguchi et al. | |
| 2019/0019813 A1 | 1/2019 | Ren et al. | |
| 2019/0027511 A1 | 1/2019 | Li et al. | |
| 2019/0067640 A1 | 2/2019 | Dong | |
| 2019/0096920 A1 | 3/2019 | Zhou et al. | |
| 2019/0103420 A1 | 4/2019 | Liu et al. | |
| 2019/0123069 A1 | 4/2019 | Yang et al. | |
| 2019/0172953 A1 | 6/2019 | Ding et al. | |
| 2019/0267409 A1 | 8/2019 | Hu et al. | |
| 2019/0386144 A1 | 12/2019 | Ding et al. | |
| 2020/0006568 A1 | 1/2020 | Yamaguchi et al. | |

FOREIGN PATENT DOCUMENTS

| | | |
|---|---|---|
| CN | 103839970 A | 6/2014 |
| CN | 104900533 A | 9/2015 |
| CN | 106876412 A | 6/2017 |
| CN | 107068613 A | 8/2017 |
| CN | 107393934 A | 11/2017 |
| CN | 207503977 U | 6/2018 |
| WO | 2019103920 A1 | 5/2019 |

OTHER PUBLICATIONS

International Search Report and Written Opinion dated Jun. 28, 2018, from application No. PCT/CN2018/080635.
First Office Action issued to Chinese Application No. 201710867028.9 dated Apr. 12, 2019 with English translation, (13p).
Second Office Action issued to Chinese Application No. 201710867028.9 dated Aug. 21, 2019 with English translation, (10p).
Third Office Action issued to Chinese Application No. 201710867028.9 dated Nov. 5, 2019 with English translation, (13p).
Decision of Rejection issued in Chinese Application No. 201710867028.9 dated Apr. 23, 2020 with English translation, (11p).
Restriction Requirement of U.S. Appl. No. 16/134,201 dated Nov. 29, 2019, (5p).
Non-Final Office Action of U.S. Appl. No. 16/134,201 dated Jan. 27, 2020, (7p).
Notice of Allowance in U.S. Appl. No. 16/134,201 dated May 1, 2020, (10p).

* cited by examiner

ARRAY SUBSTRATE, MANUFACTURING METHOD THEREOF AND DISPLAY DEVICE

CROSS REFERENCE

The present application is based upon International Application No. PCT/CN2018/080635, filed on Mar. 27, 2018, which is based upon and claims priority to Chinese Patent Application No. 201710692964.0, entitled "ARRAY SUBSTRATE, MANUFACTURING METHOD THEREOF AND DISPLAY DEVICE", filed on Aug. 14, 2017, and the entire contents thereof are incorporated herein by reference.

TECHNICAL FIELD

The present disclosure relates to the field of display technology, and in particular, to an array substrate, a manufacturing method thereof, and a display device.

BACKGROUND

Organic Light Emitting Display (OLED) display panels can be classified into two types: passive matrix OLED (PMOLED) display panel and active matrix OLED (AMOLED) display panel. Among them, the AMOLED display panel has pixel units arranged in arrays, belonging to an active display type, and has many advantages such as high luminous efficiency, high contrast, wide viewing angle, fast response speed, and ability to manufacture a large-sized flexible panel, and the like, which has been widely valued by scientists and industry, and has become a research hotspot of the new generation of flat panel display.

In the production process of an AMOLED display panel, when an active layer of another transistor needs to be formed on one transistor, it is related to several thermal treatment processes such as annealing and oven at temperature between 300° C. and 500° C. for forming an active layer.

It should be noted that the information disclosed in the background section above is only for enhancing the understanding of the background of the present disclosure, and thus may include information that does not constitute prior art known to those of ordinary skill in the art.

SUMMARY

An array substrate provided by an arrangement of the present disclosure includes a substrate, a first transistor and a second transistor disposed on the substrate. An active layer of the second transistor is disposed on a side of the interlayer dielectric layer of the first transistor away from the substrate. An insulating layer is disposed between the interlayer dielectric layer of the first transistor and the active layer of the second transistor, and the insulating layer has an ability to block hydrogen.

In a possible implementation manner, in the above array substrate provided by the arrangement of the present disclosure, the material of the active layer of the first transistor is low temperature polysilicon; the material of the active layer of the second transistor is oxide.

In a possible implementation manner, in the above array substrate provided by the arrangement of the present disclosure, the insulating layer includes at least a material selected from the group consisting of aluminum oxide, cerium-doped aluminum oxide, lanthanum-doped aluminum oxide, cerium-doped silicon oxide, and lanthanum-doped silicon oxide.

In a possible implementation manner, in the above array substrate provided by the arrangement of the present disclosure, the insulating layer has a thickness of 200 Å to 500 Å.

In a possible implementation manner, in the above array substrate provided by the arrangement of the present disclosure, a mass percentage of the doped cerium in the cerium-doped aluminum oxide or the cerium-doped silicon oxide is in a range from about 0.05% to 5%; and a mass percentage of the doped lanthanum in the lanthanum-doped aluminum oxide or the lanthanum-doped silicon oxide is in a range from about 0.05% to 5%.

In a possible implementation manner, in the above array substrate provided by the arrangement of the present disclosure, it further includes: a silicon oxide layer disposed on a side of the insulating layer facing the active layer of the second transistor.

In a possible implementation manner, in the above array substrate provided by the arrangement of the present disclosure, it further includes: a silicon nitride layer disposed between the insulating layer and the silicon oxide layer.

In a possible implementation manner, in the above array substrate provided by the arrangement of the present disclosure, a source and a drain of the first transistor are disposed between the interlayer dielectric layer of the first transistor and the insulating layer.

In a possible implementation manner, in the above array substrate provided by the arrangement of the present disclosure, a gate of the second transistor is disposed in a same layer as the source and the drain of the first transistor.

In a possible implementation manner, in the above array substrate provided by the arrangement of the present disclosure, an orthographic projection of an active layer, a source drain and a gate of the first transistor on the substrate and an orthographic projection of the active layer and a gate of the second transistor on the substrate does not coincide.

An arrangement of the present disclosure also provides a display device including the above array substrate.

An arrangement of the present disclosure further provides a method for manufacturing an array substrate. The method includes providing a substrate. The method includes forming an interlayer dielectric layer of a first transistor on the substrate. The method includes forming an insulating layer on the interlayer dielectric layer of the first transistor, the insulating layer having an ability to block hydrogen. The method includes forming an active layer of a second transistor on the insulating layer.

In a possible implementation manner, in the above manufacturing method provided by the arrangement of the present disclosure, before forming the interlayer dielectric layer of the first transistor on the substrate, the method further includes sequentially forming an active layer, a gate insulating layer, and a gate of the first transistor on the substrate.

In a possible implementation manner, in the above manufacturing method provided by the arrangement of the present disclosure, after forming the interlayer dielectric layer of the first transistor on the substrate and before forming the insulating layer having the ability to block hydrogen on the interlayer dielectric layer of the first transistor, the method further includes simultaneously forming a source and a drain of the first transistor and a gate of the second transistor on the interlayer dielectric layer by using a patterning process.

In a possible implementation manner, after forming the insulating layer having the ability to block hydrogen on the interlayer dielectric layer of the first transistor and before forming the active layer of the second transistor on the insulating layer, the method further includes sequentially forming a silicon nitride layer and a silicon oxide layer on the insulating layer.

In a possible implementation manner, a material of an active layer of the first transistor is low temperature polysilicon; and a material of the active layer of the second transistor is an oxide.

In a possible implementation manner, a material of the active layer of the second transistor is an oxide, and forming an active layer of a second transistor on the insulating layer includes depositing an oxide semiconductor layer and a photoresist layer successively on the insulating layer, exposing the photoresist layer to form an exposed photoresist pattern, developing the exposed photoresist pattern to expose the oxide semiconductor layer, thermal treating exposed oxide semiconductor layer at a temperature of 300° C. to 500° C. for 0.5 h to 1 h, and etching thermal treated oxide semiconductor layer and removing unexposed photoresist pattern to form the active layer of the second transistor.

In a possible implementation manner, after forming the active layer of the second transistor on the insulating layer, the method further includes forming a source and a drain of the second transistor on the active layer of the second transistor by a patterning process.

It should be understood that the above general description and the following detailed description are merely exemplary and explanatory, and are not limiting of the present disclosure.

This section provides an overview of various implementations or examples of the techniques described in the present disclosure, and is not a comprehensive disclosure of the full scope or all features of the disclosed technology.

DETAILED DESCRIPTION

Figure 1:
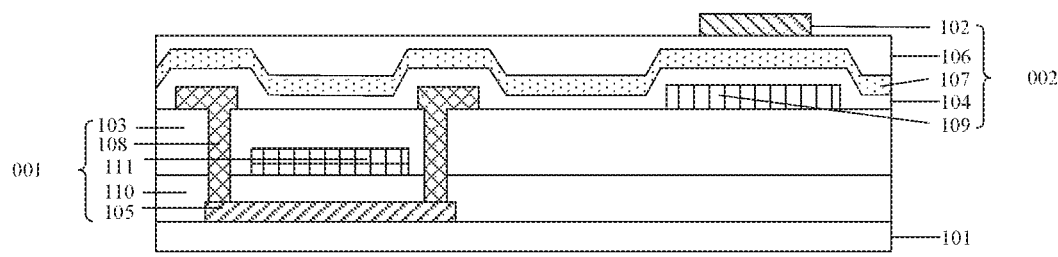
FIG. 1 is a schematic structural diagram of an array substrate according to an arrangement of the present disclosure.

The specific arrangements of an array substrate, a manufacturing method thereof and a display device provided by the arrangements of the present disclosure are described in detail below with reference to the drawings. It should be noted that the arrangements described herein are only a part of the arrangements of the present disclosure, and not all of the arrangements. All other arrangements obtained by a person of ordinary skill in the art based on the arrangements of the present disclosure without creative labor are the protection scope of the present disclosure.

The shape and size of each film layer in the drawings does not reflect the true scale of the array substrate, and is merely intended to illustrate the present disclosure.

The inventors have found that when a film layer is subjected to a thermal processing process in the production process of an AMOLED display panel, the hydrogen generated during the formation of an interlayer dielectric layer (ILD) of a transistor disposed close to a substrate may enter an active layer of a transistor away from the substrate, resulting that the electrical properties of the active layer are changed, and even the active layer is changed from a semiconductor to a conductor, thus affecting the characteristics of the transistor disposed thereon. In view of this, arrangements of the present disclosure provide an array substrate, a manufacturing method thereof, and a display device for solving the problem existing in the prior art that the hydrogen generated in the process of forming the interlayer dielectric layer of the transistor close to the substrate influences the characteristics of the transistor away from the substrate.

An array substrate provided by the arrangement of the present disclosure, as shown in FIG. 1, includes: a substrate 101, a first transistor 001 and a second transistor 002 disposed on the substrate 101.

An active layer 102 of the second transistor 002 is disposed on a side of the interlayer dielectric layer 103 of the first transistor 001 away from the substrate 101.

An insulating layer 104 is disposed between the interlayer dielectric layer 103 of the first transistor 001 and the active layer 102 of the second transistor 002, and the insulating layer 104 has an ability to block hydrogen.

Specifically, in the above array substrate provided by the arrangement of the present disclosure, the interlayer dielectric layer 103 of the first transistor 001 is generally composed of a silicon nitride layer and a silicon oxide layer. As the source gas for forming the silicon nitride layer, $NH_3$, $NH_2H_2N$, $N_2$, or the like can be used as the nitrogen source gas, and in the present arrangement, $NH_3$ is selected. $SiH_4$, $Si_2H_6$, $SiCl_4$, $SiHCl_3$, $SiH_2Cl_2$, $SiH_3Cl_3$, $SiF_4$, or the like can be used as the silicon source gas, and in the present arrangement, $SiH_4$ is selected. Accordingly, a considerable amount of hydrogen may be generated in the process of forming the silicon nitride layer. The insulating layer 104 capable of blocking hydrogen is disposed between the interlayer dielectric layer 103 of the first transistor 001 and the active layer 102 of the second transistor 002, therefore, adopting the insulating layer 104 can effectively avoid the phenomenon that the hydrogen generated in the process of forming the interlayer dielectric layer of the first transistor diffuses to the active layer of the second transistor, resulting in degradation of performance of the second transistor.

Low Temperature Poly-silicon (LTPS) technology and oxide technology are used to develop AMOLED display panels due to their respective advantages. Specifically, the low temperature polysilicon transistor contributes to achieving high resolution, low power consumption, high image quality, and the like of the AMOLED display panel; the metal oxide transistor has the advantages of high mobility, good film uniformity, low process temperature, small $I_{off}$ and the like, and is compatible with the manufacturing process of the amorphous silicon transistor, which is beneficial to reduce the development cost of the AMOLED display panel.

In view of the above, in the above array substrate provided by the arrangement of the present disclosure, the active layer 105 of the first transistor 001 may include low temperature polysilicon; the active layer 102 of the second transistor 002 may include an oxide. Specifically, the active layer 102 of the second transistor 002 may include any one or more of In—Ga—Zn—O, In—Ga—O, Ga—Zn—O, In—Hf—Zn—O, In—Sn—Zn—O, In—Sn—O, In—Zn—O, Zn—Sn—O, In—Al—Zn—O, or the like.

In a specific implementation, in the above array substrate provided by the arrangement of the present disclosure, the insulating layer 104 may include at least a material selected from the group consisting of aluminum oxide, cerium-doped aluminum oxide, lanthanum-doped aluminum oxide, cerium-doped silicon oxide, and lanthanum-doped silicon oxide, and the like, which is not specifically limited herein.

Specifically, since the rare earth element has a strong chemical affinity with the hydrogen to adsorb and dissolve the hydrogen in a large amount, a stable hydride can be rapidly formed when the rare earth element doped in alumina or silicon oxide meets the hydrogen atoms generated in the process of forming the interlayer dielectric layer 103 of the first transistor 001, thus blocking diffusion of the hydrogen to the active layer 102 of the second transistor 002. Further, these hydrides have a high melting point and a large specific gravity, that is, they do not easily diffuse, and can be dispersed as fine particles in the matrix without affecting the properties of other layers.

Further, since the rare earth element lanthanum can be rapidly combined with the hydrogen at 150° C. to 300° C. to form a dihydro compound or trihydro compound having a decomposition temperature of 1000° C. or higher; the rare earth element cerium can be rapidly combined with the hydrogen at 100° C. to form a dihydro compound or trihydro compound having a decomposition temperature of 700° C. or higher. The hydride of ruthenium and osmium does not decompose during the subsequent thermal treatment process at a temperature of 300° C.-500° C., so that it is better to prevent the hydrogen generated in the formation of the interlayer dielectric layer 103 of the first transistor 001 from diffusing to the active layer 102 of the second transistor 002. Therefore, in some arrangements, the rare earth element cerium or rare earth element lanthanum may be selected for doping.

Further, the alumina itself is relatively dense, and it is also possible to block the diffusion of the hydrogen generated in the process of forming the interlayer dielectric layer 103 of the first transistor 001 to the active layer 102 of the second transistor 002 to some extent. Moreover, in general, a silicon oxide layer is used as a gate insulating layer in the transistor. In the arrangement of the present disclosure, silicon oxide is used as a film substrate without affecting the dielectric constant of the gate insulating layer (GI) of the second transistor 002.

Further, in the above array substrate provided by the arrangement of the present disclosure, the mass percentage of cerium doped in the cerium-doped aluminum oxide or the cerium-doped silicon oxide may be 0.05% to 5%, and the mass percentage of lanthanum doped in the lanthanum-doped aluminum oxide or the lanthanum-doped silicon oxide may be 0.05% to 5%. In a specific implementation, the amount of doped lanthanum or cerium can be designed according to the amount of the hydrogen produced during the process of forming the interlayer dielectric layer 103 of the first transistor 001 by using different equipment and different process conditions. In general, the more the hydrogen is produced, the more doping lanthanum or cerium is required; and the less the hydrogen is produced, the less doping lanthanum or cerium is required.

In a specific implementation, in the above array substrate provided by the arrangement of the present disclosure, the insulating layer 104 may have a thickness of 200 Å to 500 Å. Of course, in the specific implementation, the thickness of the insulating layer may be set according to actual needs, which is not specifically limited herein.

In a specific implementation, if there is still free lanthanum or cerium after the lanthanum or cerium ions doped in the insulating layer 104 are combined with all the hydrogen, the free lanthanum or cerium may enter the active layer 102 of the second transistor 002. In order to prevent the doped lanthanum or cerium from entering the active layer 102 of the second transistor 002, in the above-mentioned array substrate provided by the arrangement of the present disclosure, it further includes: a silicon oxide layer 106 disposed on the side of the insulating layer 104 facing the active layer 102 of the second transistor 002. Moreover, the silicon oxide layer 106 may have a thickness of 1000 Å to 2000 Å.

Specifically, in order to further prevent the doped lanthanum or cerium from entering the active layer 102 of the second transistor 002, in the above-mentioned array substrate provided by the arrangement of the present disclosure, it further includes: a silicon nitride layer 107 disposed between the insulating layer 104 and the silicon oxide layer 106; and the silicon nitride layer 107 may have a thickness of 1000 Å to 2000 Å. In addition, the silicon nitride layer 107 may also be disposed between the interlayer dielectric layer 103 of the first transistor 001 and the insulating layer 104, which is not limited herein.

In a specific implementation, in the above array substrate provided by the arrangement of the present disclosure, as shown in FIG. 1, the source and the drain 108 of the first transistor 001 may be specifically disposed between the interlayer dielectric layer 103 of the first transistor 001 and the insulating layer 104.

In a specific implementation, in order to simplify the fabrication process, in the above array substrate provided by the arrangement of the present disclosure, as shown in FIG. 1, the gate 109 of the second transistor 002 may be disposed in the same layer as the source and the drain 108 of the first transistor 001. Moreover, the insulating layer 104, the silicon nitride layer 107, and the silicon oxide layer 106 disposed between the layer of the gate electrode 109 and the active layer 102 of the second transistor 002 can be collectively multiplexed into the insulating layer of the second transistor 002.

Further, as shown in FIG. 1, in the above array substrate provided by the arrangement of the present disclosure, the first transistor 001 may further include: the source layer 105, the gate insulating layer 110 and the gate electrode 111 disposed between the substrate 101 and the interlayer dielectric layer 103 of the first transistor 001. The source and the drain 108 of the first transistor 001 are electrically connected to the active layer 105 through via holes passing through the interlayer dielectric layer 103 and the gate insulating layer 110 of the first transistor 001. The second transistor 002 may further include a source and drain electrodes (not illustrated in the drawings) disposed on the side surface of the active layer 102 of the second transistor 002 facing away from the substrate 101.

Further, as shown in FIG. 1, in the above array substrate provided by the arrangement of the present disclosure, the orthographic projection of the active layer 105, the source and the drain 108 and the gate electrode 111 of the first transistor 001 on the substrate does not coincide with the orthographic projection of the active layer 102 and the gate 109 of the second transistor 002 on the substrate. In the present disclosure, the term "coincide" may be interpreted as occupying the same place, or being exactly alike in position or form. However, it should be understood that a margin (e.g., 10%) may exist due to for example manufacturing tolerance between two items that are coincide.

It should be noted that, in the above array substrate provided by the arrangement of the present disclosure, the first transistor 001 and the second transistor 002 may both be a bottom gate transistor or a top gate transistor, which is not limited herein. In addition, when the first transistor 001 and the second transistor 002 are disposed in the display region of the array substrate, and both of them may be set as driving transistors or switching transistors according to actual needs, which is not limited herein.

Correspondingly, the arrangement of the present disclosure provides a method for manufacturing an array substrate.

The principle of solving the problem is similar to the principle of solving the problem of the array substrate. Therefore, the implementation of the manufacturing method provided by the arrangement of the present disclosure can be seen the implementation of the above array substrate provided by the arrangements of the present disclosure, which will not be repeated here.

Figure 2:
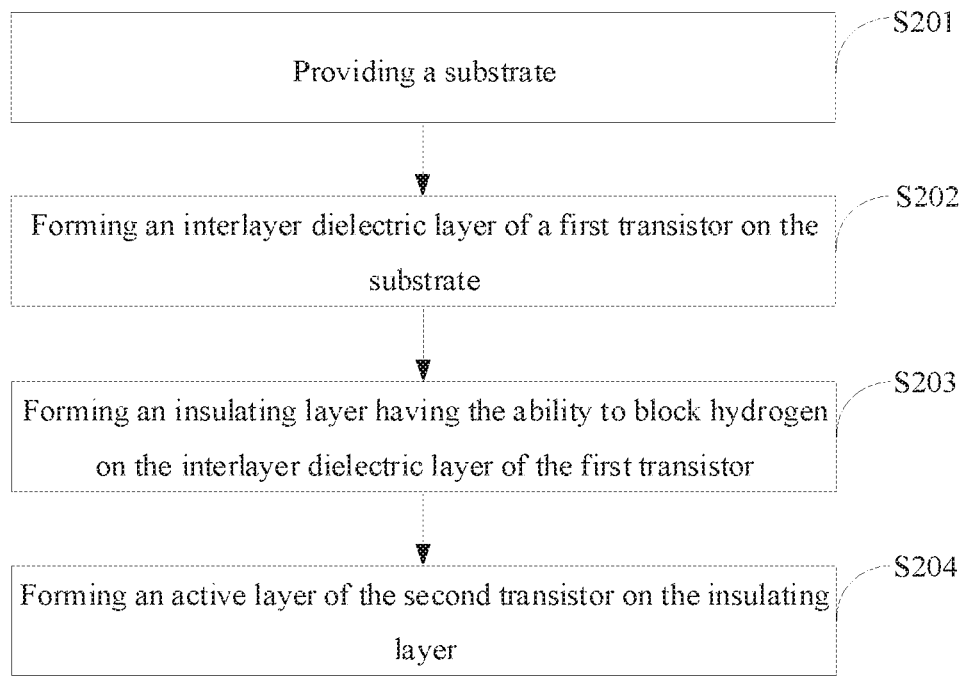
FIG. 2 is a flow chart of a method for manufacturing an array substrate according to an arrangement of the present disclosure.

Specifically, the method for manufacturing an array substrate provided by the arrangement of the present disclosure, as shown in FIG. 2, may specifically include the following blocks:

S201, providing a substrate;

S202, forming an interlayer dielectric layer of the first transistor 001 on the substrate;

S203, forming an insulating layer having the ability to block hydrogen on the interlayer dielectric layer of the first transistor 001;

S204, forming an active layer of the second transistor 002 on the insulating layer.

In a specific implementation, in the above manufacturing method provided by the arrangement of the present disclosure, before the block S202 is performed to form the interlayer dielectric layer of the first transistor 001 on the substrate, the following blocks are generally performed: sequentially forming an active layer, a gate insulating layer, and a gate of the first transistor 001 on the substrate.

In a specific implementation, in order to simplify the fabrication process, the source and the drain of the first transistor 001 may be disposed in the same layer as the gate of the second transistor 002. That is, in the above manufacturing method provided by the arrangement of the present disclosure, after forming the interlayer dielectric layer of the first transistor on the substrate in block S202 and before forming the insulating layer having the ability to block hydrogen on the interlayer dielectric layer of the first transistor 001 in block S203, the method further includes: simultaneously forming a source and a drain of the first transistor and a gate of the second transistor 002 on the interlayer dielectric layer by using a patterning process.

In a specific implementation, in order to prevent the rare earth ions such as cerium or lanthanum doped in the insulating layer from diffusing into the active layer of the second transistor 002, in the above manufacturing method provided by the arrangement of the present disclosure, after forming the insulating layer having the ability to block hydrogen on the interlayer dielectric layer of the first transistor 001 in block S203 and before forming an active layer of the second transistor 002 on the insulating layer in block S204, the following blocks may be performed: sequentially forming a silicon nitride layer and a silicon oxide layer on the insulating layer.

In a specific implementation manner, in the above manufacturing method provided by the arrangement of the present disclosure, the active layer of the first transistor 001 includes low temperature polysilicon; and the active layer of the second transistor 002 includes an oxide.

Further, in the above manufacturing method provided by the arrangement of the present disclosure, when the active layer of the second transistor 002 includes an oxide, forming an active layer of the second transistor 002 on the insulating layer in block S204, which can specifically be achieved by performing the following operations: depositing an oxide semiconductor layer and a photoresist layer successively on the insulating layer; exposing the photoresist layer to form an exposed photoresist pattern; developing the exposed photoresist pattern to expose the oxide semiconductor layer; thermal treating the exposed oxide semiconductor layer at a temperature of 300° C. to 500° C. for 0.5 h to 1 h; and etching the thermal treated oxide semiconductor layer and removing the unexposed photoresist pattern to form an active layer of the second transistor 002.

Generally, in the above manufacturing method provided by the arrangement of the present disclosure, after forming an active layer of the second transistor 002 on the insulating layer in block S204, the method may further include forming a source and a drain of the second transistor 002 on the active layer of the second transistor 002 by a patterning process.

It can be understood that, when the oxide semiconductor layer is subjected to thermal treatment, it has the ability to block the hydrogen due to the presence of the insulating layer 104, which can combine with the hydrogen, and prevent the oxide semiconductor layer from being affected to ensure the performance of the transistor.

It should be noted that, in the above manufacturing method provided by the arrangements of the present disclosure, the patterning process involved in forming each film layer structure may include not only a part or all of the processes of deposition, photoresist coating, mask masking, exposure, development, etching and stripping of the photoresist, but also include other processes, which are specifically based on the desired pattern in the actual manufacturing process, and are not limited herein. For example, an oven process may also be included after development and prior to etching.

In the present disclosure, the deposition process may be a chemical vapor deposition method, a thermal vapor deposition method, a plasma enhanced chemical vapor deposition method, or a physical vapor deposition method, which is not limited herein; the mask used in the mask process may be a halftone mask, a single slit diffraction mask or a gray tone mask, which is not limited herein; the etching may be dry etching or wet etching, which is not limited herein.

Based on the same inventive concept, an arrangement of the present disclosure further provides a display device, including the above array substrate provided by the arrangement of the present disclosure, which may be any product or component that has a display function: a mobile phone, a tablet computer, a television, a display, a notebook computer, a digital photo frame, a navigator, smart watch, fitness wristband, personal digital assistant, etc. For the implementation of the display device, refer to the arrangement of the above array substrate, and the repeated description is omitted.

The array substrate, the manufacturing method thereof and the display device provided by the arrangement of the present disclosure include: a first transistor and a second transistor; an active layer of the second transistor is disposed on a side of the interlayer dielectric layer of the first transistor away from the substrate; an insulating layer is disposed between the interlayer dielectric layer of the first transistor and the active layer of the second transistor, and the insulating layer has an ability to block hydrogen. Since the insulating layer is disposed between the interlayer dielectric layer of the first transistor and the active layer of the second transistor and has the ability to block hydrogen, a phenomenon that the hydrogen generated in the process of forming the interlayer dielectric layer of the first transistor diffuses to the active layer of the second transistor, resulting in degradation of performance of the second transistor is effectively avoided.

The beneficial effects of the present disclosure are as follows:

The array substrate, the manufacturing method thereof, and the display device according to some arrangements of the present disclosure include: a first transistor and a second transistor; an active layer of the second transistor is disposed on a side of the interlayer dielectric layer of the first transistor away from the substrate; an insulating layer is disposed between the interlayer dielectric layer of the first transistor and the active layer of the second transistor, and the insulating layer has an ability to block hydrogen. Since the insulating layer is disposed between the interlayer dielectric layer of the first transistor and the active layer of the second transistor and has the ability to block hydrogen, it will effectively prevent the hydrogen generated in the process of forming the interlayer dielectric layer of the first transistor from being diffused to the active layer of the second transistor and resulting in degradation of performance of the second transistor.

It should be noted that, relational terms such as first and second are used merely to distinguish one entity or operation from another entity or operation herein without necessarily requiring or implying that there are any such actual relationships or sequences between these entities or operations.

It will be apparent to those skilled in the art that various modifications and changes can be made in the present disclosure without departing from the spirit and scope of the present disclosure. Thus, if such modifications and variations of the present disclosure are within the scope of the appended claims and their equivalents, the present disclosure is also intended to cover such modifications and variations.

What is claimed is:

1. An array substrate, comprising: a substrate, a first transistor and a second transistor disposed on the substrate; wherein
    an active layer of the second transistor is disposed on one side of an interlayer dielectric layer of the first transistor away from the substrate; and
    an insulating layer is disposed between the interlayer dielectric layer of the first transistor and the active layer of the second transistor, and the insulating layer has an ability to block hydrogen, wherein the insulating layer is disposed on a source electrode and a drain electrode of the first transistor and a gate electrode of the second transistor, and the insulating layer directly contacts and covers the source electrode and the drain electrode of the first transistor and the gate electrode of the second transistor;
    wherein the insulating layer comprises at least a material selected from the group consisting of cerium-doped aluminum oxide, lanthanum-doped aluminum oxide, cerium-doped silicon oxide, and lanthanum-doped silicon oxide,
    wherein a mass percentage of the doped cerium in the cerium-doped aluminum oxide or the cerium-doped silicon oxide is in a range from about 0.05% to 5%; and a mass percentage of the doped lanthanum in the lanthanum-doped aluminum oxide or the lanthanum-doped silicon oxide is in a range from about 0.05% to 5%; and
    wherein the insulating layer has a thickness of 200 Å to 500 Å.

2. The array substrate according to claim 1, wherein the active layer of the first transistor comprises low temperature polysilicon; and the active layer of the second transistor comprises an oxide.

3. The array substrate according to claim 1, further comprising: a silicon oxide layer disposed on one side of the insulating layer facing the active layer of the second transistor.

4. The array substrate according to claim 3, further comprising: a silicon nitride layer disposed between the insulating layer and the silicon oxide layer.

5. The array substrate according to claim 1, wherein the source electrode and the drain electrode of the first transistor are disposed between the interlayer dielectric layer of the first transistor and the insulating layer.

6. The array substrate of claim 5, wherein the gate electrode of the second transistor is disposed in a same layer as the source electrode and the drain electrode of the first transistor.

7. The array substrate according to claim 1, wherein an orthographic projection of an active layer, the source electrode, the drain electrode and a gate of the first transistor on the substrate and an orthographic projection of the active layer and the gate electrode of the second transistor on the substrate do not coincide.

8. A display device, comprising: the array substrate according to claim 1.

* * * * *